United States Patent
Wei

(10) Patent No.: US 8,157,912 B2
(45) Date of Patent: Apr. 17, 2012

(54) METHOD OF CONVERTING PCA TO SAPPHIRE AND CONVERTED ARTICLE

(75) Inventor: George C. Wei, Weston, MA (US)

(73) Assignee: OSRAM SYLVANIA Inc., Danvers, MA (US)

( * ) Notice: Subject to any disclaimer, the term of this patent is extended or adjusted under 35 U.S.C. 154(b) by 1253 days.

(21) Appl. No.: 11/853,392

(22) Filed: Sep. 11, 2007

(65) Prior Publication Data

US 2009/0069168 A1 Mar. 12, 2009

(51) Int. Cl.
*C30B 1/02* (2006.01)

(52) U.S. Cl. .......................... 117/4; 117/5; 117/8; 117/9

(58) Field of Classification Search .................. 117/4, 5, 117/8, 9
See application file for complete search history.

(56) References Cited

U.S. PATENT DOCUMENTS

| | | | |
|---|---|---|---|
| 4,177,321 A * | 12/1979 | Nishizawa | 428/446 |
| 5,451,553 A | 9/1995 | Scott et al. | |
| 5,487,353 A | 1/1996 | Scott et al. | |
| 5,549,746 A | 8/1996 | Scott et al. | |
| 5,579,427 A | 11/1996 | Rusanov et al. | |
| 5,588,992 A | 12/1996 | Scott et al. | |
| 5,683,949 A | 11/1997 | Scott et al. | |
| 6,048,394 A | 4/2000 | Harmer et al. | |
| 6,159,441 A | 12/2000 | Mohri et al. | |
| 6,214,427 B1 | 4/2001 | Levinson | |
| 6,475,942 B1 | 11/2002 | Brewer et al. | |

FOREIGN PATENT DOCUMENTS

| | | |
|---|---|---|
| EP | 0 625 594 A2 | 11/1994 |
| EP | 0 645 475 A1 | 3/1995 |
| EP | 0 645 477 A2 | 3/1995 |
| EP | 0 667 404 A1 | 8/1995 |

OTHER PUBLICATIONS

Abstract, JP 59174591, Oct. 3, 1984 Suwa, et al.
M.P.Winnen, "A Study of Solid State Crystal Conversion in Co-doped Alumina", Masters Thesis, Case Western Reserve University, Mar. 16, 2001.
C.D. Greskovich et al., "Solid State Crystal Conversion, Final Report Jul. 27, 1995-Sep. 30, 1997," NTIS report, Contract No. F33615-94-D-5801 (1997).
C.D. Greskovich, "Solid state crystal conversion (SSCC) of translucent PCA into single crystal sapphire via discontinuous grain growth," presentation at DARPA/ARL Transparent Armor Workshop (1998).
C. Greskovich and J. A. Brewer, "Solubility of Magnesia in Polycrystalline Alumina at High Temperatures," J. Am. Ceram. Soc., 84 [2] 420-425 (2001).
N. Yamamoto and S. Matsuzawa, "The solid phase epitaxial growth method," pp. 39-44, Fine Ceramics, ed. S. Saito, Ohmsha Ltd, 1985.

(Continued)

*Primary Examiner* — Bob M Kunemund
(74) *Attorney, Agent, or Firm* — Robert F. Clark

(57) ABSTRACT

Polycrystalline alumina (PCA) that has been doped with magnesium oxide is converted to sapphire by additionally doping the PCA with boron oxide and sintering to induce abnormal grain growth. The boron oxide may be added to an already formed green PCA ceramic shape by applying an aqueous boric acid solution to the green ceramic and heating the green ceramic in air to convert the boric acid to boron oxide.

14 Claims, 1 Drawing Sheet

OTHER PUBLICATIONS

T. Yamamoto and T. Sakuma, "Preparation of BaTiO3 single crystals by sintering," pp. 209-215, Proc. 2nd Jap. Int. SAMPE, 1991.

T. Yamamoto and T. Sakuma, "Fabrication of Barium Titanate Single Crystals by Solid-State Grain Growth," J. Am. Cer. Soc., 77 [1] 1107-09 (1994).

G. Thompson et al., "Conversion of Polycrystalline Alumina to Single-Crystal Sapphire by Localized Coping with Silica," J. Am. Cer. Soc. 87 [10] 1879-1882 (2004).

S. J. Dillon and M.P. Harmer, "Mechanism of 'Solid-State' Single Crystal Conversion in Alumina," J. Am. Cer. Soc., 90 [3] 993-995 (2007).

S. Ray, "Preparation and Characterization of Aluminum Borate," J. Am. Cer. Soc. 75 [9] 2605-9 (1992).

M. Readey, "Formation and Sintering Characteristics of Aluminum Borate Whiskers," J. Am. Cer. Soc., 75 [12] 3452-6 (1992).

T. Chen et al., "Synthesis and microstructure of boron-doped alumina membranes prepared by the sol-gel method," Materials Letters 50 (2001) 353-7.

Scott et al., "Conversion of Polycrystalline Al2O3 into Single-Crystal Sapphire by Abnormal Grain Growth," J. Am. Cer. Soc., 85 [5] 1275-80 (2002).

* cited by examiner

US 8,157,912 B2

METHOD OF CONVERTING PCA TO SAPPHIRE AND CONVERTED ARTICLE

BACKGROUND OF THE INVENTION

Translucent polycrystalline alumina (PCA) has been used in the lighting industry for many years as the material of choice to form the arc discharge vessels (also generally referred to as arc tubes) of high pressure sodium lamps (HPS) and ceramic metal halide lamps. Transparent sapphire has been used more sparingly as an arc tube material mainly because of its higher cost, but also because it is limited to regular geometric shapes like tubes, rods or sheets. Unlike PCA vessels which can be formed from powdered alumina into a wide variety of shapes from cylindrical to nearly spherical using a number of different manufacturing processes such as isostatic pressing, extrusion, slip casting, or injection molding, sapphire is typically grown slowly from a melt which limits the available shapes useable for discharge vessels to generally tubular. For these reasons and others, the use of sapphire has been limited to specialty lamps which require sapphire's transparency to meet stringent optical requirements, e.g., automobile headlamps.

Several attempts have been made to convert PCA to sapphire. For example, U.S. Pat. Nos. 5,549,746 and 5,451,553 describe a method of solid state crystal conversion (SSCC) that transforms MgO-doped PCA to sapphire at 200° C. below the melting point of sapphire. A $Ga_2O_3$ dopant also has been utilized to enhance the SSCC conversion. The enhancing effect was attributed to accelerated diffusion of Mg ions along grain boundaries due to the presence of the Ga ions. Similarly U.S. Pat. No. 6,475,942 discloses that Mo also enhances conversion. However, the use of Mo tends to darken the converted arc tubes which is not desirable for optical applications.

The conversion of MgO-doped PCA to sapphire by chemical addition with colloidal $SiO_2$ has also been demonstrated. A local counter-doping of prefired tubes with $SiO_2$ assisted the conversion without adversely affecting the sintering to translucency. The counter-doping caused abnormal grain growth to be triggered locally, and thereby controlled the initiation of the growth process. However, the reproducibility and the degree of conversion continue to be issues for the counter-doping conversion.

SUMMARY OF THE INVENTION

Full conversion of PCA to single crystal sapphire is very difficult to achieve. In fact, even commercially grown sapphire tubes can be expected to contain upwards of several very large grains within a single cross section. Similarly, sapphire from converted PCA will often consist of several very large grains. In particular, sufficiently large converted-PCA sapphire parts will typically have one or more very large grains that are at least 10mm in length with small, 15-50 µm, unconverted grains trapped within the very large converted-sapphire grains. See, e.g., Scott et al., *Conversion of Polycrystalline $Al_2O_3$ into Single-Crystal Sapphire by Abnormal Grain Growth*, J. Am. Cer. Soc., 85 [5] 1275-80 (2002). Although not a single crystal, converted-PCA sapphire is suitable for lighting applications. The converted-PCA sapphire doesn't exhibit the spontaneous cracking that plagues large-grained (70-200 µm) PCA because the grain boundaries in the converted-PCA sapphire are of a low-angle, stable type. Still, it is preferred that the individual converted-PCA sapphire parts for lighting applications consist only of 1-4 very large grains.

Converted-PCA sapphire is also capable of exhibiting an in-line transmittance that is substantially equivalent that of commercially melt-grown sapphire. For example, the single-wall in-line transmittance for sapphire is about 87%. In the case of unpolished converted-PCA sapphire, the in-line transmittance estimated from measurements on converted capillary tubes is about 72%. The lower in-line transmittance is because the converted-PCA sapphire retains the surface morphology of the original PCA after conversion. The rougher surface induces scattering which lowers the in-line transmittance. However, after polishing, the converted-PCA sapphire can attain an in-line transmittance of about 81%. The remaining factor which limits the converted-PCA sapphire from attaining a higher in-line transmittance is the presence of residual pores in the converted-PCA sapphire. Still, these in-line transmittance levels (polished and unpolished) compare very favorably to the in-line transmittance values for standard PCA for lighting applications. In particular, unpolished PCA will typically have an in-line transmittance of about 33% and polished PCA about 40%.

The inventor has discovered that boron oxide enhances conversion of MgO-doped PCA to sapphire and is particularly useful for MgO-doped PCA compositions which also include yttria and zirconia additives. Normally, the latter compositions have grain boundaries that are very resistant to abnormal grain growth. However, the boron oxide dopant is able to overcome these stubborn boundaries and induce grain growth leading to fully converted PCA. Moreover, in contrast to other known conversion-enhancing agents, the addition of boron oxide in PCA has no detrimental, side effects such as graying.

Boron oxide by itself is not a sintering aid for the densification of alumina compacts. For example, in other types of alumina ceramics, alumina doped with boron oxide has required additional CaO and $SiO_2$ sintering aids for densification. Boron in alumina ceramics tends to retain or even increase porosity during sintering. This effect appears to have been useful in making porous ceramics supports for catalyst where a high level of fine porosity is desired. For lighting applications, it is necessary to use a MgO dopant in the PCA. Typically, the amount of MgO by weight ranges from about 100 ppm to about 2000 ppm, and, preferably, from about 200 to about 500 ppm. The MgO is necessary for sintering PCA to translucency. Other co-dopants such as $ZrO_2$, $Y_2O_3$, $La_2O_3$, $Tb_2O_3$, $Sc_2O_3$, $Er_2O_3$ and other rare earth oxides may be added the MgO dopant, but the MgO dopant must be used. The key role of the MgO dopant is that it allows for the annihilation of pores through grain boundary diffusion of oxygen and aluminum species. A secondary spinel phase however precipitates if the solubility of MgO in alumina is exceeded at the sintering temperature.

Preferably, the percent weight equivalent boron oxide added to the MgO-doped PCA ranges from about 80 ppm to about 8000 ppm, and, more preferably from about 300 ppm to about 800 ppm. Other boron sources, such as boron metal and boron nitride, are not effective in producing converted-PCA sapphire as they result in the formation of aluminum borides unless these materials are converted to boron oxide prior to sintering, e.g., by firing in air.

The boron oxide is typically added in a precursor form such as boric acid. The boric acid is then converted to boron oxide by heating in air, usually at about 500° C. to about 1350° C. for about 1 hour to about 24 hours. The reason for using boric acid is that it is soluble in water, which facilitates homogenous doping of the alumina and allows for a greater range of doping methods. For example, an aqueous solution of boric acid may be added to an MgO-containing alumina powder prior to forming the green shape or it may be added after the green shape has been prefired to remove the organic binder. In one embodiment of the method, an aqueous boric acid solution is sprayed onto the alumina powder and the powder allowed to dry before mixing with an organic binder. Alternatively, the boric acid is added to alumina powder that has been slurried with a small amount of water. After a thorough mixing, for example with a ball mill, the water is removed by freeze drying to produce a uniform distribution of boric acid throughout the alumina powder. The doped-alumina powder can then be processed by conventional techniques to make the green shape, including, for example, isostatic pressing, slip casting, gel casting, injection molding or extrusion. Conversion of the boric acid to boron oxide could take place prior to forming the green shape or during the prefiring stage when the binder is removed. In another embodiment, the aqueous solution is applied to the surface of the prefired alumina part and dried. This may done for example by spraying or painting on the solution, or soaking the part. Multiple applications of the aqueous solution may be needed to achieve the correct dopant level. After the application of the solution, the part is dried and heated in air to convert the boric acid to boron oxide.

The sapphire conversion occurs by heating the boron oxide-doped PCA at a temperature from about 1800° C. to about 1975° C., and, preferably, from about 1850° C. to about 1950° C. The time to complete the conversion will depend on several variables, e.g., temperature, part thickness, and dopant levels. Small capillary tubes may be converted in about 1 to 2 hours whereas larger-diameter and long parts may take upwards of about 15 to 40 hours.

Thus, in accordance with one aspect of the invention, there is provided a method for converting polycrystalline alumina to sapphire, the method comprising: doping a ceramic article comprised of MgO-doped polycrystalline alumina with from about 80 ppm to about 8000 ppm by weight boron oxide to form a boron-oxide doped ceramic article; and sintering the boron-oxide doped ceramic article at a temperature and for a time sufficient to induce grain growth and convert the polycrystalline alumina to sapphire.

In accordance with another aspect of the invention, there is provided a ceramic article, comprising converted-PCA sapphire containing boron oxide.

DETAILED DESCRIPTION OF THE INVENTION

Figure 1:
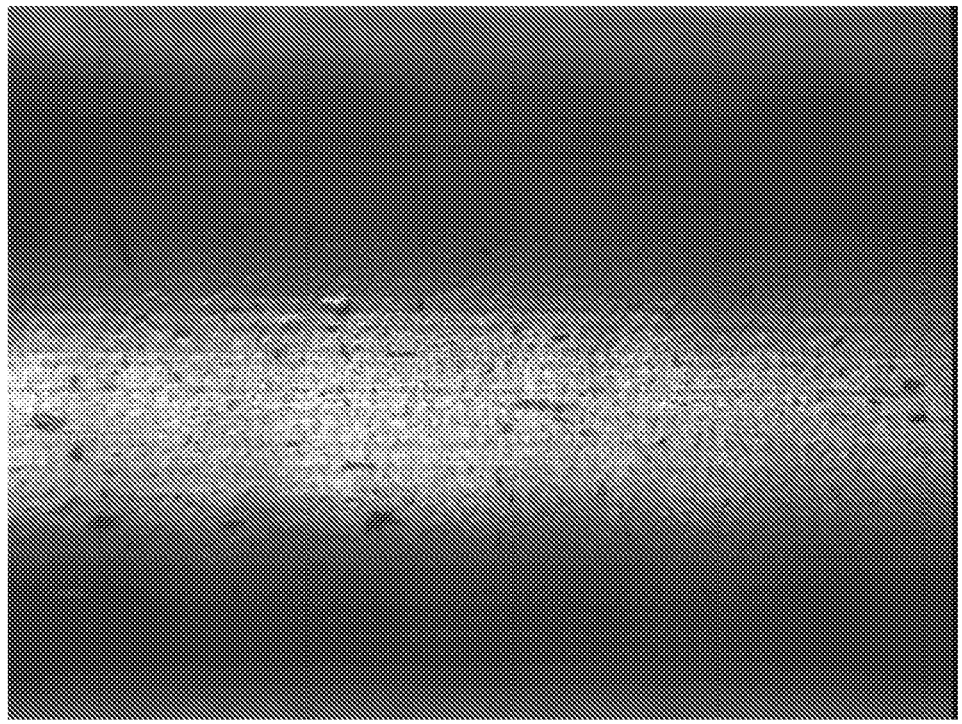
FIG. 1 is a low-magnification, reflected-light image of a converted-PCA tube (Composition B) that had been impregnated with a 375 ppm $H_3BO_3$ solution. The image height is approximately 2 mm.

For a better understanding of the present invention, together with other and further objects, advantages and capabilities thereof, reference is made to the following disclosure and appended claims taken in conjunction with the above-described drawings.

An amount of boron in the form of boric acid ($H_3BO_3$) was dissolved in de-ionized water. Nine aqueous solutions were prepared (5%, 0.5%, 500 ppm, 375 ppm, 250 ppm, 100 ppm, 50 ppm by weight of $H_3BO_3$). PCA tubes formed from a mixture of an organic binder and alumina powder doped with 500-800 ppm MgO alone, or with a combination of 200-300 ppm MgO+10-40 ppm $Y_2O_3$+300-500 ppm $ZrO_2$, were prefired 850-1350° C. in air to remove the organic binder and impart additional mechanical strength. The prefired PCA tubes were impregnated with the boric acid solutions and dried in vacuum desiccators. The impregnation step was repeated twice more to achieve the final doping level. The impregnated, prefired tubes were then re-heated in air at 900° C. for 2 hours to convert the boric acid to boron oxide. This resulted in a boron dopant in the form of boron oxide covering the range of 80 ppm to 0.8 weight percent (wt. %) $B_2)_3$ in the PCA. For example, the impregnation/drying using the 375 ppm $H_3BO_3$ aqueous solution resulted in 600 ppm boron oxide in the PCA.

Two sizes of PCA capillaries were used: 2.0 mm OD by 1.1 mm ID, and 2.3 mm OD by 0.7 mm ID. 35 W PCA arc tubes (substantially spherical geometry) were also used. These PCA arc tube components were sintered by traversing a hot zone (1-2 h in hot zone) set at 1850-1935° C. under flowing $N_2$-8% $H_2$ in a belt furnace. The 5% $H_3BO_3$ soaked PCA (either doped with 500 ppm MgO only: referred to herein as Composition A, or doped with 200 ppm MgO, 400 ppm $ZrO_2$ and 20 ppm $Y_2O_3$: referred to herein as Composition B), showed considerable sagging and creep deformation. This is consistent with the $B_2O_3$—$Al_2O_3$ phase diagram which shows a $B_2O_3$-rich $B_2O_3$—$Al_2O_3$ liquidus at 470° C., decomposition of $B_2O_3$-$2Al_2O_3$ to $2B_2O_3$-$9Al_2O_3$ and a $B_2O_3$-rich $B_2O_3$—$Al_2O_3$ liquid at 1035° C., and melting of $2B_2O_3$-$9Al_2O_3$ at 1950° C.

For PCA of Composition B, a number of parts showed enhanced abnormal grain growth with some grains as large as 1 mm. In particular, the 375 ppm $H_3BO_3$ soaked PCA of Composition B consistently sintered to a high in-line transmittance in a nearly fully converted state. The sintered capillaries of Composition B impregnated with 600 ppm boron oxide (using the 375 ppm $H_3BO_3$ solution) exhibited a strikingly higher transparency compared to the controls which were not impregnated with boron oxide. Such converted-PCA capillaries still had some residual large grains, but the parts were crack-free. Apparently, significant grain re-arrangement occurred as the conversion proceeded in the boron oxide-doped Composition B capillaries, relaxing grain boundary energies and reducing associated residual stresses that otherwise would be present in the boundaries of large grains.

Figure 2:
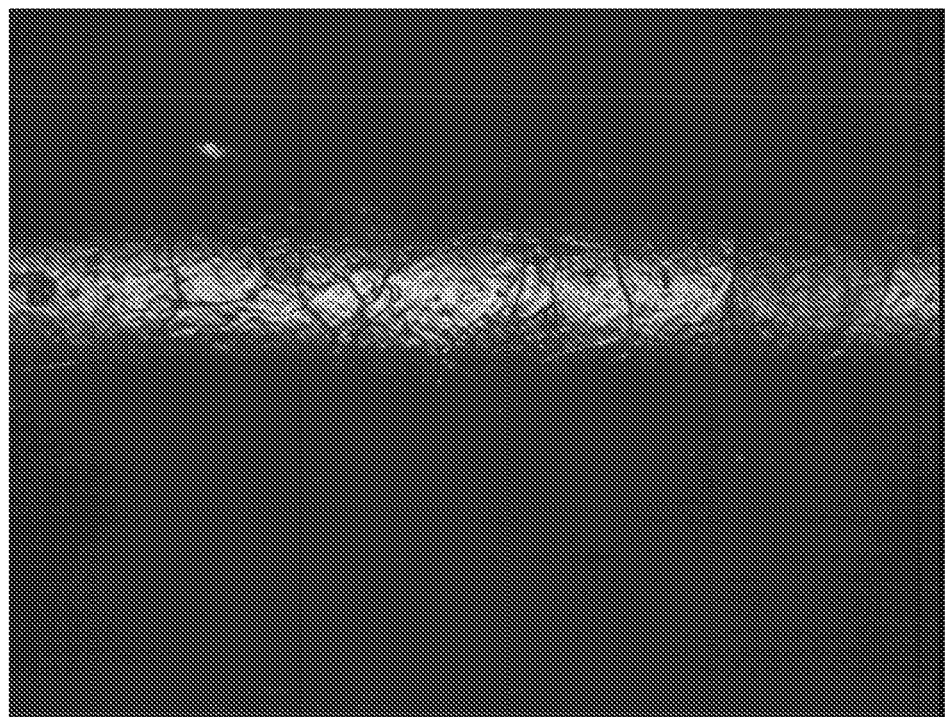
FIG. 2 is a low-magnification, reflected-light image of a converted-PCA tube (Composition B) that had been impregnated with a 500 ppm $H_3BO_3$ solution. The image height is approximately 2 mm.

FIG. 1 shows the fully converted portion over a sizable length of the outside surface of the capillaries doped with the 375 ppm $H_3BO_3$ solution and heat-treated at 1880° C. (0.06 inch/min, $N_2$-8% $H_2$, belt furnace). More concentrated $H_3BO_3$ solutions (>375 ppm) enhanced abnormal grain growth, but the boundaries of the large grains doped with such high levels of boron oxide were relatively stable and did not proceed to full conversion over a large length as shown in FIG. 2 (1880° C., 0.06 inch/min, $N_2$-8% $H_2$, belt furnace, 500 ppm $H_3BO_3$ solution). Composition B capillaries impregnated with lower boron oxide levels showed enhanced abnormal grain growth, but less than those doped at the 600 ppm boron oxide level. For the tubes of Composition A (doped with MgO only), the effect of boron oxide on conversion was less profound than the tubes of Composition B. All the boron oxide-doped PCA of Composition A showed enhanced abnormal grain growth, but not to the same degree of conversion as the boron oxide-doped PCA of Composition B.

Experiments were also conducted in a static furnace (wet hydrogen, W-element, Mo-shield) at 1850° C. The appearance of the converted capillaries was comparable.

While there have been shown and described what are at present considered to be preferred embodiments of the invention, it will be apparent to those skilled in the art that various changes and modifications can be made herein without departing from the scope of the invention as defined by the appended claims.

What is claimed is:

1. A method for converting polycrystalline alumina to sapphire, the method comprising:
   doping a ceramic article comprised of MgO-doped polycrystalline alumina with from about 80 ppm to about 8000 ppm by weight boron oxide to form a boron-oxide doped ceramic article; and
   sintering the boron-oxide doped ceramic article at a temperature and for a time sufficient to induce grain growth and convert the polycrystalline alumina to sapphire.

2. The method of claim 1 wherein the polycrystalline alumina further contains yttrium oxide and zirconium oxide.

3. The method of claim 1 wherein the ceramic article is doped with from about 300 ppm to about 800 ppm by weight boron oxide.

4. The method of claim 1 wherein the ceramic article is doped with boron oxide by means of an aqueous solution of boric acid wherein the boric acid is converted to boron oxide by heating in air prior to sintering.

5. The method of claim 4 wherein the aqueous solution is applied to a surface of the ceramic article.

6. The method of claim 1 wherein the ceramic article is doped with boron oxide by adding boric acid to an alumina powder containing MgO, combining the alumina powder with an organic binder to form a mixture, forming the mixture into a green shape, and heating the green shape in air to remove the organic binder and form the boron-oxide doped ceramic article.

7. The method of claim 1 wherein the ceramic article contains from about 100 ppm to about 2000 ppm by weight MgO.

8. The method of claim 1 wherein the ceramic article contains from about 200 ppm to about 500 ppm by weight MgO.

9. The method of claim 8 wherein the ceramic article is doped with from about 300 ppm to about 800 ppm by weight boron oxide.

10. The method of claim 1 wherein the ceramic article is sintered at a temperature from about 1800° C. to about 1975° C. for about 1 hour to about 40 hours.

11. The method of claim 10 wherein the ceramic article is sintered at a temperature from about 1850° C. to about 1950° C.

12. The method of claim 4 wherein the boric acid is converted to boron oxide by heating at a temperature from about 500° C. to about 1350° C.

13. A method for converting polycrystalline alumina to sapphire, the method comprising:
   doping a ceramic article comprised of MgO-doped polycrystalline alumina with from about 80 ppm to about 8000 ppm by weight boron oxide to form a boron-oxide doped ceramic article, the ceramic article containing from about 100 ppm to about 2000 ppm by weight MgO; and
   sintering the boron-oxide doped ceramic article at a temperature from about 1800° C. to about 1975° C. for about 1 hour to about 40 hours to convert the polycrystalline alumina to sapphire.

14. The method of claim 13 wherein the ceramic article contains from about 200 ppm to about 500 ppm by weight MgO and is doped with from about 300 ppm to about 800 ppm by weight boron oxide.

* * * * *